United States Patent
Dally

(10) Patent No.: US 10,128,904 B2
(45) Date of Patent: Nov. 13, 2018

(54) LOW-LATENCY BI-DIRECTIONAL REPEATER

(71) Applicant: NVIDIA Corporation, Santa Clara, CA (US)

(72) Inventor: William J. Dally, Los Altos Hills, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 22 days.

(21) Appl. No.: 14/748,079

(22) Filed: Jun. 23, 2015

(65) Prior Publication Data

US 2016/0380674 A1 Dec. 29, 2016

(51) Int. Cl.
*H04B 3/36* (2006.01)
*H03K 19/017* (2006.01)
*H04L 25/02* (2006.01)
*H04B 1/56* (2006.01)

(52) U.S. Cl.
CPC .......... *H04B 3/36* (2013.01); *H03K 19/01721* (2013.01); *H04L 25/0272* (2013.01); *H04L 25/0292* (2013.01); *H04B 1/56* (2013.01)

(58) Field of Classification Search
CPC .......... H04L 25/0272; H04L 25/03878; H04L 25/20; H04L 27/01; H04L 25/0292; H03K 19/01721; H03K 17/063; H04B 3/36; H04B 1/56

See application file for complete search history.

(56) References Cited

U.S. PATENT DOCUMENTS

| | | | | |
|---|---|---|---|---|
| 5,287,386 A * | 2/1994 | Wade | ............... | H03K 3/356147 375/257 |
| 7,142,018 B2 * | 11/2006 | Masleid | ........... | H03K 19/01721 326/23 |
| 7,279,925 B1 * | 10/2007 | Richmond | ....... | H03K 19/01721 326/26 |
| 2003/0160630 A1 * | 8/2003 | Earle | ........................ | H03K 5/12 326/17 |
| 2004/0257131 A1 * | 12/2004 | Sivero | ........................ | G06F 1/10 327/165 |
| 2013/0094307 A1 * | 4/2013 | Cheng | ................... | G11C 11/419 365/191 |

OTHER PUBLICATIONS

Nalamalpu et al., "Boosters for driving long onchip interconnects—design issues, interconnect synthesis, and comparison with repeaters," in IEEE Transactions on Computer-Aided Design of Integrated Circuits and Systems, vol. 21, No. 1, pp. 50-62, Jan. 2002.*

* cited by examiner

*Primary Examiner* — Michelle M Koeth
(74) *Attorney, Agent, or Firm* — Zilka-Kotab, P.C.

(57) ABSTRACT

A repeater circuit is disclosed. The repeater circuit is coupled to a transmission line driven by a first transmitter circuit and configured to detect a signal transition from a first voltage level to a second voltage level at a first position on the transmission line. The repeater circuit then reinforces the signal transition from the second voltage level to a third voltage level at the first position on the transmission line without interrupting a current through the transmission line.

20 Claims, 12 Drawing Sheets

LOW-LATENCY BI-DIRECTIONAL REPEATER

This invention was made with Government support under LLNS subcontract B609478 awarded by DOE, and with Government support under Agreement HR0011-13-3-0001 awarded by DARPA. The Government has certain rights in this invention.

FIELD OF THE INVENTION

The present invention relates to integrated circuits, and more particularly to techniques for reducing the latency associated with interconnects of integrated circuits.

BACKGROUND

Integrated circuits utilize interconnects to transmit signals from one portion of the circuit to another portion of the circuit. Interconnects within an integrated circuit typically comprise wires (i.e., traces) formed in a metal layer of the integrated circuit. Each wire is associated with a resistance and a capacitance that is related to the physical design of the wire (e.g., cross section, length, etc.). Transmitting signals on these wires is not instantaneous. Changing a signal on the wire requires the wire to be charged or discharged. There is a time delay for a signal to travel down a wire that is characterized by an RC time constant associated with the wire (i.e., a resistance of the wire in ohms multiplied by a capacitance of the wire). Because both resistance of a wire and capacitance of a wire increase linearly with a wire's length, the time delay increases as a square of the wires length.

In order to decrease the time delay associated with a long interconnect, active circuit(s) can be introduced along the long interconnect to break the long interconnect up into multiple shorter interconnects. Because the time delay of the short interconnects, added together, is less than the time delay of the long interconnect, a relatively faster link can be provided over the same linear distance of the integrated circuit. FIG. 1A illustrates a conventional CMOS (Complementary Metal Oxide Semiconductor) repeater link 100, in accordance with the prior art. The link 100 includes a plurality of interconnects (e.g., 112, 114, 116, 118, etc.) connected to a number of repeaters (e.g., inverters 102, 104, 106, etc.). The repeaters shown in FIG. 1A are conventional CMOS inverters. It will be appreciated that an even number of repeaters (and an odd number of interconnects) may be used to ensure the signal at the end of the link 100 is the same polarity as the signal at the beginning of the link 100. The repeaters reduce the delay of the link 100 even though an "insertion delay" (i.e., delay incurred to transmit a signal from the input of a repeater to the output of the repeater) is introduced for each repeater that is inserted into the link 100.

The link 100 may be used to transmit a signal, A, from one end of the link 100 to the other end of the link 100. For example, the interconnect 112 may be charged to high potential ($V_{dd}$) to match a logic high state of signal A. The inverter 102 then discharges interconnect 114 to a low potential ($V_{ss}$) to match an inverted state of signal A, i.e., a logic low state of signal $\overline{A}$. The inverter 104 then charges interconnect 116 to a high potential ($V_{dd}$) to match an inverted state of signal $\overline{A}$, i.e., a logic high state of signal A. The inverter 106 then discharges interconnect 118 to a low potential ($V_{ss}$) to match an inverted state of signal A, i.e., a logic low state of signal $\overline{A}$, and so forth until the end of the link is reached and the last interconnect is charged to a high potential ($V_{dd}$) to match a logic high state of signal A at the beginning of the link 100.

FIG. 1B illustrates a conventional CMOS inverter 120, in accordance with the prior art. One or more of the inverters 102, 104, and 106, may be implemented as the inverter 120. When an inverter 120 is inserted into a link 100, a first current flows from the link 100 to an input of the inverter 120 to the gates of transistors 121 and 122. Either transistor 121 or 122 is enabled. When transistor 121 is enabled and transistor 122 is disabled, a second current is generated from $V_{dd}$ to the output of the inverter 120 through the transistor 121. When transistor 121 is disabled and transistor 122 is enabled, the second current is generated from the output to ground through the transistor 122. The input is coupled to a first node of the link 100 and the output is coupled to a second node of the link 100, so that the link 100 is not a continuous wire. For example, the input of an inverter 120 implementing the repeater 102 is coupled to a first node at an end of the interconnect 112 and the output of the inverter 120 implementing the repeater 102 is coupled to a second node at an end of the interconnect 114. The inverter 120 replaces a signal received at the input with a second signal (i.e., an inverted version of the first signal) that is generated at the output of the inverter 120. The inverter 120 interrupts the first current and generates the second current to transmit the signal from the input to the output. Importantly, the inverter 120 only transmits a signal in one direction, from the input to the output.

While the repeaters reduce the delay of the link 100, the repeaters also limit the direction of the link 100. In other words, signals may only be transmitted in one direction, from the input of inverter 102 to the output of inverter 106. Without the repeaters, signals may be transmitted by the link 100 in both directions. Thus, there is a need for addressing these issues and/or other issues associated with the prior art.

SUMMARY

A repeater circuit is disclosed. The repeater circuit is coupled to a transmission line driven by a first transmitter circuit and configured to detect a signal transition from a first voltage level to a second voltage level at a first position on the transmission line. The repeater circuit then reinforces the signal transition from the second voltage level to a third voltage level at the first position on the transmission line without interrupting a current through the transmission line.

DETAILED DESCRIPTION

In the context of the present invention, a transmission line is an interconnect that is driven by at least one transmitter circuit to transmit a signal to at least one receiver circuit. The signal may be a pulse encoded by a voltage transition. For example, a low pulse may be encoded by a transition from a high voltage level to a low voltage level, remaining at the low voltage for a time interval, and then transitioning to the high voltage level. Similarly, a high pulse may be encoded by a transition from a low voltage level to a high voltage level, remaining at the high voltage for a time interval, and then transitioning to the low voltage level. Alternatively a high signal may be encoded by the absence of a low pulse.

Figure 2:
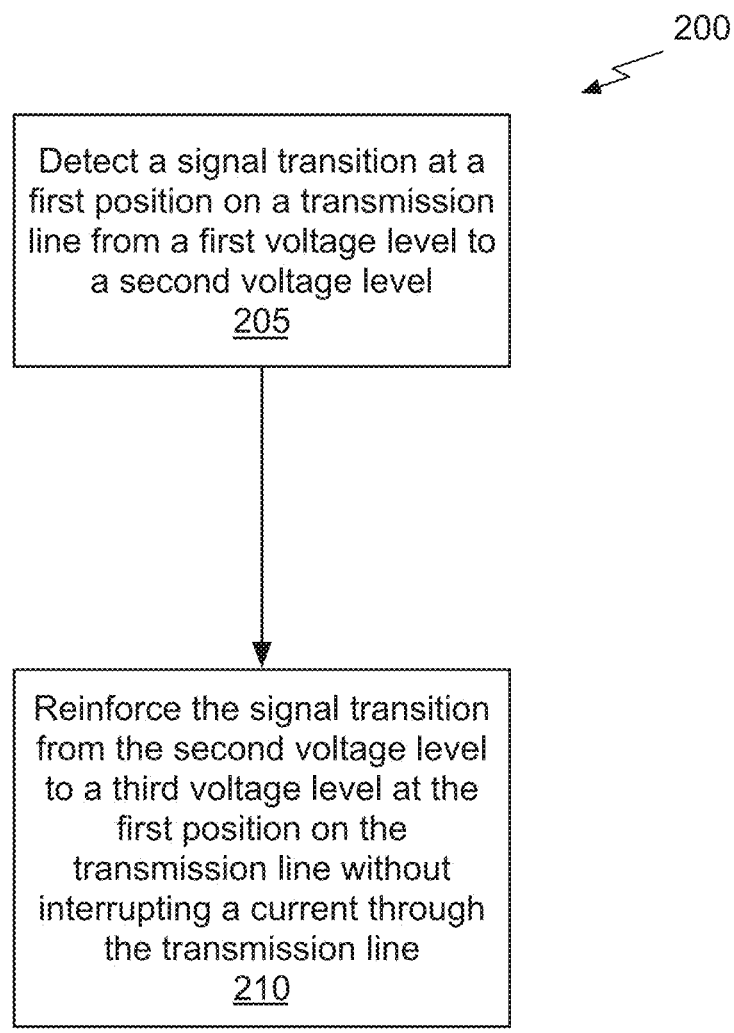
FIG. 2 illustrates a flowchart of a method for transmitting a signal using a repeater, in accordance with one embodiment.

FIG. 2 illustrates a flowchart of a method 200 for transmitting a signal using a repeater, in accordance with one embodiment. Although method 200 is described in conjunction with the systems of FIGS. 3A, 3B, 8, 9, and 10, persons of ordinary skill in the art will understand that any system that performs method 200 is within the scope of embodiments of the present invention. In one embodiment, a repeater, such as repeater 320 of FIG. 3B is configured to perform method 200. The repeater may reside within an integrated circuit, or within any other technically feasible circuitry associated with a system.

At step 205, a repeater circuit that is coupled to a transmission line driven by a first transmitter circuit detects a signal transition from a first voltage level to a second voltage level at a first position on the transmission line. In one embodiment, the first voltage level is higher than the second voltage level. In another embodiment, the first voltage level is lower than the second voltage level. In one embodiment, the first voltage level is a high supply voltage, such as $V_{dd}$. In another embodiment, the first voltage level is a low supply voltage such as $V_{ss}$ or ground.

At step 210, the repeater circuit reinforces the signal transition from the second voltage level to a third voltage level at the first position on the transmission line without interrupting a current through the transmission line. In one embodiment, the transmission line is a continuous wire and the repeater circuit is coupled to the transmission line without breaking the transmission line into two or more interconnects. In one embodiment, the second voltage level is higher than the third voltage level. In another embodiment, the second voltage level is lower than the third voltage level. In one embodiment, the third voltage level is the low supply voltage.

In one embodiment, the repeater circuit is a bi-directional repeater that adds no insertion delay to signals transmitted along the transmission line. In the context of the present invention, the bi-directional repeater may be coupled to a transmission line of a bus structure enabling a transmitter circuit to send a signal that is received by one or more receivers coupled to opposing ends of the transmission line.

Figure 3A:
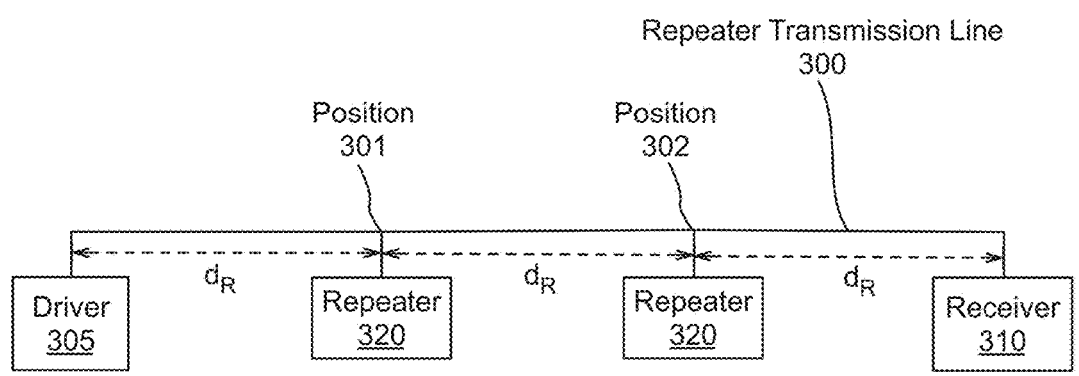
FIG. 3A illustrates a repeater transmission line, in accordance with one embodiment.
Figure 3B:
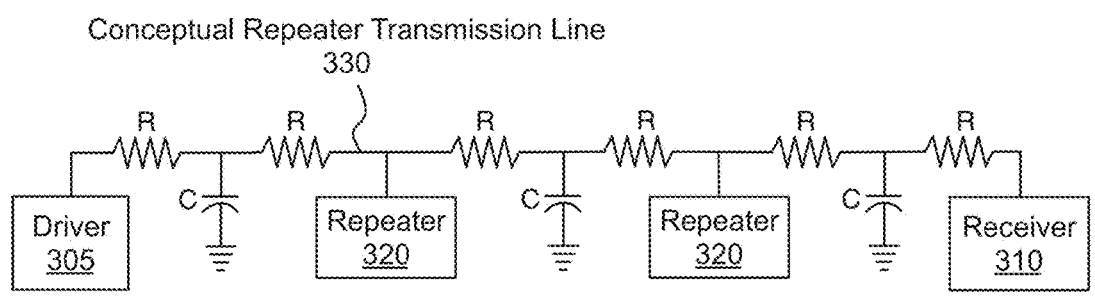
FIG. 3B illustrates a conceptual repeater transmission line, in accordance with one embodiment.

FIG. 3A illustrates a repeater transmission line 300, in accordance with one embodiment. Repeaters 320 are located at intervals $d_R$ along the repeater transmission line 300. As shown in FIG. 3A, a first repeater 320 is located at a position 301 along the repeater transmission line 300 and a second repeater 320 is located at a position 302 along the repeater transmission line 300. Each repeater 320 is directly coupled to the repeater transmission line 300, but does not interrupt the current flow through the repeater transmission line 300. Each repeater 320 assists a signal that is transmitted from a driver 305 (i.e., transmitter circuit) to a receiver 310 (e.g., receiver circuit) rather than replacing the signal. The repeater transmission line 300 is directly coupled between the driver 305 to the receiver 310.

FIG. 3B illustrates a conceptual repeater transmission line 330, in accordance with one embodiment. The effective resistance and effective capacitance of the repeater transmission line 330 is shown explicitly as resisters (R) and capacitors (C) that are distributed along the conceptual repeater transmission line 330.

Figure 3C:
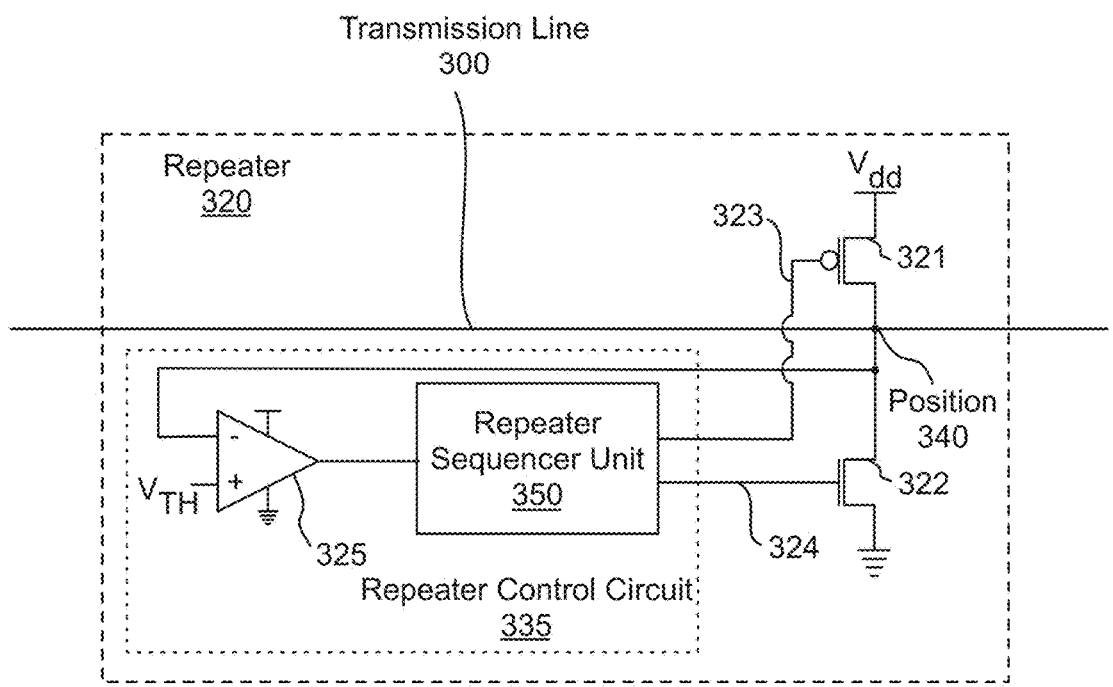
FIG. 3C illustrates the repeater circuit shown in FIG. 3A, in accordance with another embodiment.

FIG. 3C illustrates the repeater circuit 320 shown in FIG. 3A, in accordance with another embodiment. The repeater 320 includes a repeater control circuit 335, a first switching mechanism 321, and a second switching mechanism 322. The first switching mechanism is coupled between a position 340 on the transmission line 300 and a low supply voltage. As shown in FIG. 3C, in one embodiment, the low supply voltage is a ground power supply voltage and the first switching mechanism 322 is a pull-down NFET (n-channel field-effect transistor) switching mechanism. The second switching mechanism 321 is coupled between a position 340 on the transmission line 300 and a high supply voltage. As shown in FIG. 3C, in one embodiment, the high supply voltage is a $V_{DD}$ power supply voltage and the second switching mechanism is a pull-up PFET (p-channel field-effect transistor) switching mechanism. In the above examples, the switching mechanisms are described as being field-effect transistors, but the teachings disclosed herein will be readily understood by persons of ordinary skill in the art as being equally applicable to other switching devices.

The transmission line 300 is sensed by an amplifier 325 that detects a signal transition on the transmission line 300. In one embodiment, a signal transition from a first voltage level to a second voltage level is detected when the transmission line 300 falls to a predetermined threshold voltage $V_{TH}$. In other words, in one embodiment, the second voltage level equals $V_{TH}$ and the second voltage level is lower than the first voltage level and higher than the third voltage level. In one embodiment, when the first voltage level is lower than the second voltage level, the second voltage level equals $V_{TH}$ and the second voltage level is higher than the first voltage level and lower than the third voltage level. For the circuit shown in FIG. 3C, the second voltage level is lower than the first voltage level.

When the output of the amplifier 325 detects a signal transition, a repeater sequencer unit 350 begins to activate the switching mechanism 322 by asserting control signal 324 to reinforce the signal transition from the second voltage level to the third voltage level. In one embodiment, the repeater sequencer unit 350 is a delay-line sequencer circuit. In one embodiment, when a signal transition is detected, the repeater sequencer unit 350 controls the first switching mechanism to reinforce the signal transition by activating the first switching mechanism 322 for a first time interval $t_L$. Importantly, current flowing through the transmission line 300 is not interrupted when the first switching mechanism 322 is activated. Instead, the signal transition from the first voltage level to the second voltage level is reinforced. For the circuit shown in FIG. 3C, the first voltage level is the high supply voltage, the second voltage level is $V_{TH}$, and the third voltage level is lower than either the first or the second voltage levels.

After a delay of $t_W$, the repeater sequencer unit 350 may then activate the second switching mechanism 321 by negating control signal 323 to restore the first voltage level at the position 340 on the transmission line 300. Importantly, current flowing through the transmission line 300 is not interrupted when the second switching mechanism 321 is activated. Current flowing through the transmission line 300 is also not interrupted when the first switching mechanism 322 and the second switching mechanism 321 are disabled, releasing the transmission line 300, during the time interval $t_W$.

Figure 1A:
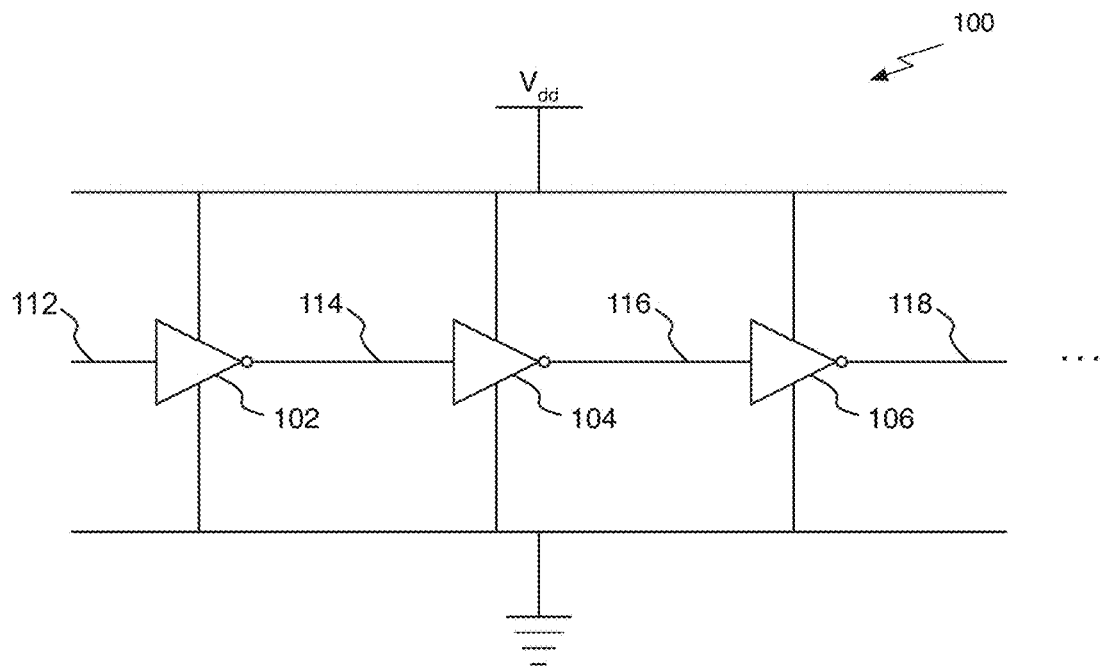
FIG. 1A illustrates a conventional CMOS repeater link, in accordance with the prior art.
Figure 1B:
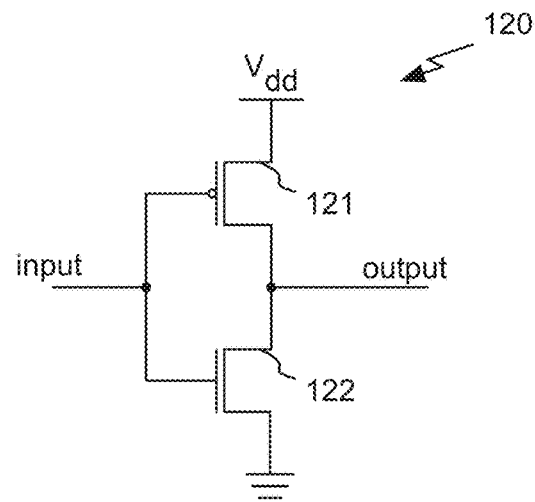
FIG. 1B illustrates a conventional CMOS inverter, in accordance with the prior art.

Unlike the conventional CMOS inverter 120 illustrated in FIG. 1B, the first switching mechanism 322 and the second switching mechanism 321 do not decouple the input from the output, receiving a first current via the link 100 and generating a second current on the link 100. Instead, both the first switching mechanism 322 and the second switching mechanism 321 are coupled to the transmission line 300 at the position 340. A single node is produced at the position 340 to couple both the first switching mechanism 322 and the second switching mechanism 321 to the transmission line 300, so that the transmission line 300 is a continuous wire. Importantly, the repeater 320 may transmit a signal in either direction on the transmission line 300.

Figure 4:
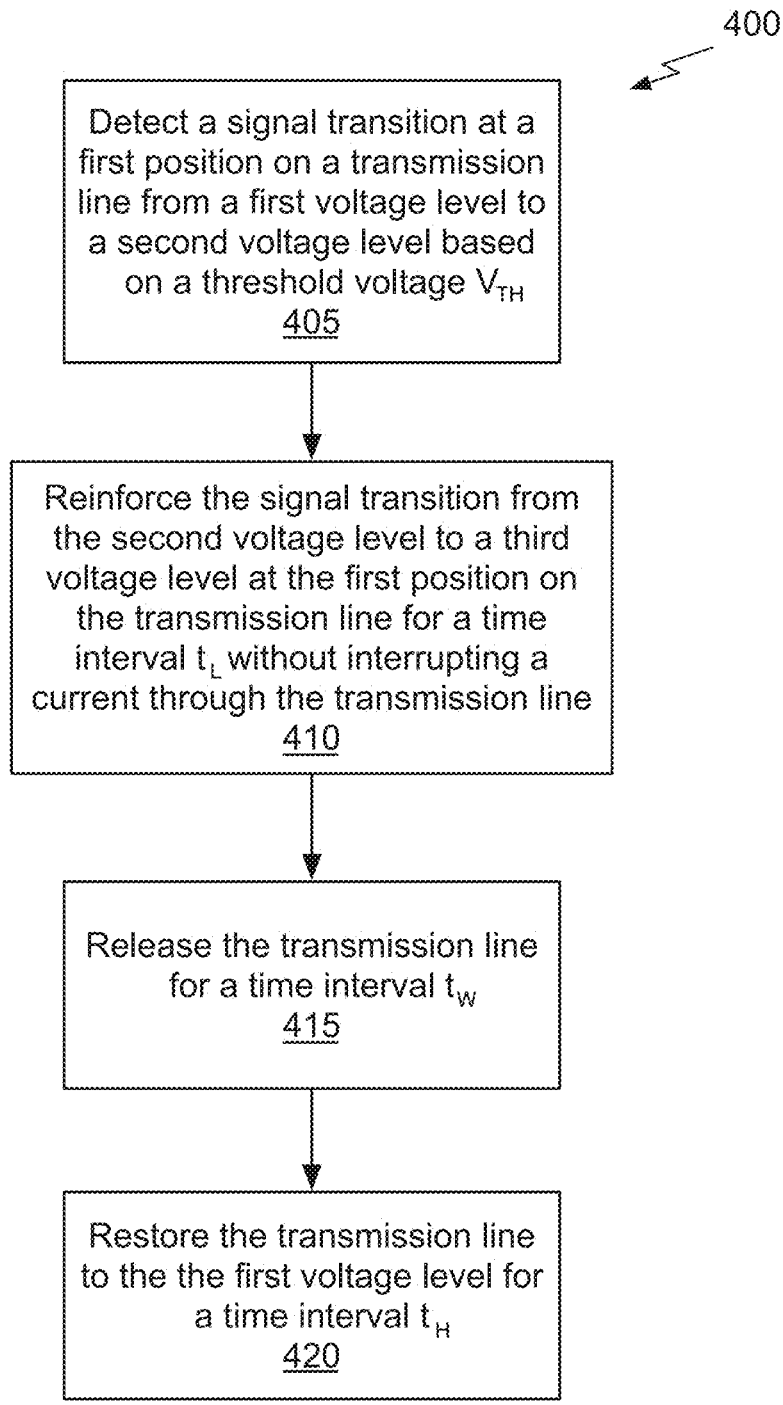
FIG. 4 illustrates another flowchart of a method for transmitting a signal using a repeater, in accordance with one embodiment.

FIG. 4 illustrates another flowchart of a method 400 for transmitting a signal using a repeater 320, in accordance with one embodiment. Although method 400 is described in conjunction with the systems of FIGS. 3A, 3B, 8, 9, and 10, persons of ordinary skill in the art will understand that any system that performs method 400 is within the scope of embodiments of the present invention. In one embodiment, a repeater, such as repeater 320 of FIG. 3B is configured to perform method 400. The repeater may reside within an integrated circuit, or within any other technically feasible circuitry associated with a system.

At step 405, the repeater circuit 320 that is coupled to the transmission line 300 driven by a first transmitter circuit detects a signal transition from a first voltage level to a second voltage level at the position 340 on the transmission line based on a threshold voltage $V_{TH}$. In one embodiment, the first voltage level is higher than the second voltage level. In another embodiment, the first voltage level is lower than the second voltage level. In one embodiment, the first voltage level is a high supply voltage, such as $V_{dd}$. In another embodiment, the first voltage level is a low supply voltage such as $V_{ss}$ or ground.

At step 410, the repeater circuit 320 reinforces the signal transition from the second voltage level to a third voltage level at the position 340 on the transmission line 300 for a time interval $t_L$ without interrupting a current through a transmission line 300. In one embodiment, the transmission line 300 is a continuous wire and the repeater circuit 320 is coupled to the transmission line 300 without breaking the transmission line 300 into two or more interconnects. In one embodiment, the second voltage level equals $V_{TH}$ and the second voltage level is lower than the first voltage level and higher than the third voltage level. In one embodiment, when the first voltage level is lower than the second voltage level, the second voltage level equals $V_{TH}$ and the second voltage level is lower than the first voltage level and higher than the third voltage level.

In one embodiment, the repeater circuit 320 is a bi-directional repeater that adds no insertion delay to signals transmitted along the transmission line 300. In the context of the present invention, the bi-directional repeater may be coupled to a transmission line of a bus structure enabling a transmitter circuit to send a signal that is received by one or more receivers coupled to opposing ends of the transmission line.

At step 415, the repeater 320 releases the transmission line 300 for a time interval $t_W$. During the time interval $t_W$ neither the first switching mechanism 322 nor the second switching mechanism 321 is activated. At step 420, the repeater 320 restores the transmission line 300 to the first voltage level for a time interval $t_H$. After the time interval $t_H$, the repeater 320 may release the transmission line 300. A time delay may be needed after $t_H$ before the repeater 320 is sensitive to detect another signal transition on the transmission line 300. The time delay may be an inhibition time interval $t_I$.

Figure 5A:
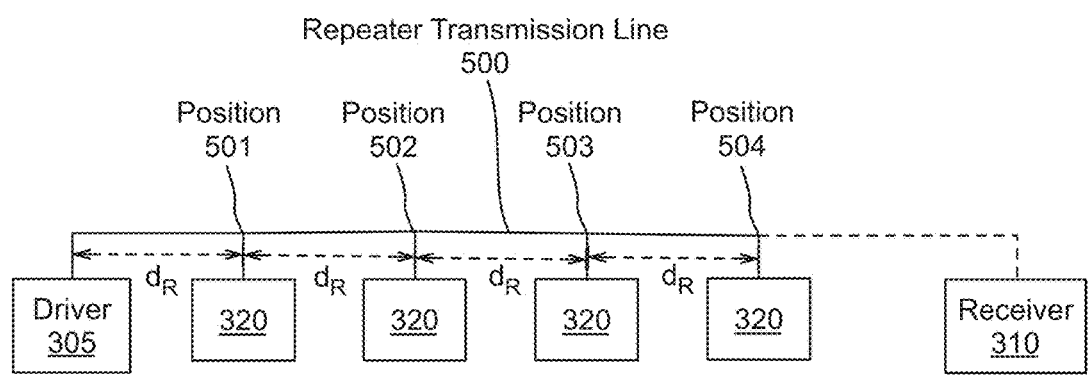
FIG. 5A illustrates a repeater transmission line, in accordance with another embodiment.

FIG. 5A illustrates a repeater transmission line 500, in accordance with another embodiment. Repeaters 320 are located at intervals $d_R$ along the repeater transmission line 500. In one embodiment, $d_R$ is 250 µm. As shown in FIG. 5A, a first repeater 320 is located at a position 501 along the repeater transmission line 500, a second repeater 320 is located at a position 502 further from the driver 305 along the repeater transmission line 500, a third repeater 320 is located at a position 503 even further from the driver 305 along the repeater transmission line 500, and a fourth repeater 320 is located at a position 504 further yet from the driver 305 along the repeater transmission line 500. Additional repeaters 320 may be coupled to the repeater transmission line 500 between position 504 and the receiver 310. In one embodiment, the position 504 is located 1 mm from the driver 305 along the transmission line 500.

Each repeater 320 is directly coupled to the repeater transmission line 500, but does not interrupt the current flow through the repeater transmission line 500. Each repeater 320 assists a signal that is transmitted from a driver 305 (i.e., transmitter circuit) to a receiver 310 (e.g., receiver circuit) rather than replacing the signal. The repeater transmission line 500 is directly coupled between the driver 305 and the receiver 310.

Figure 5B:
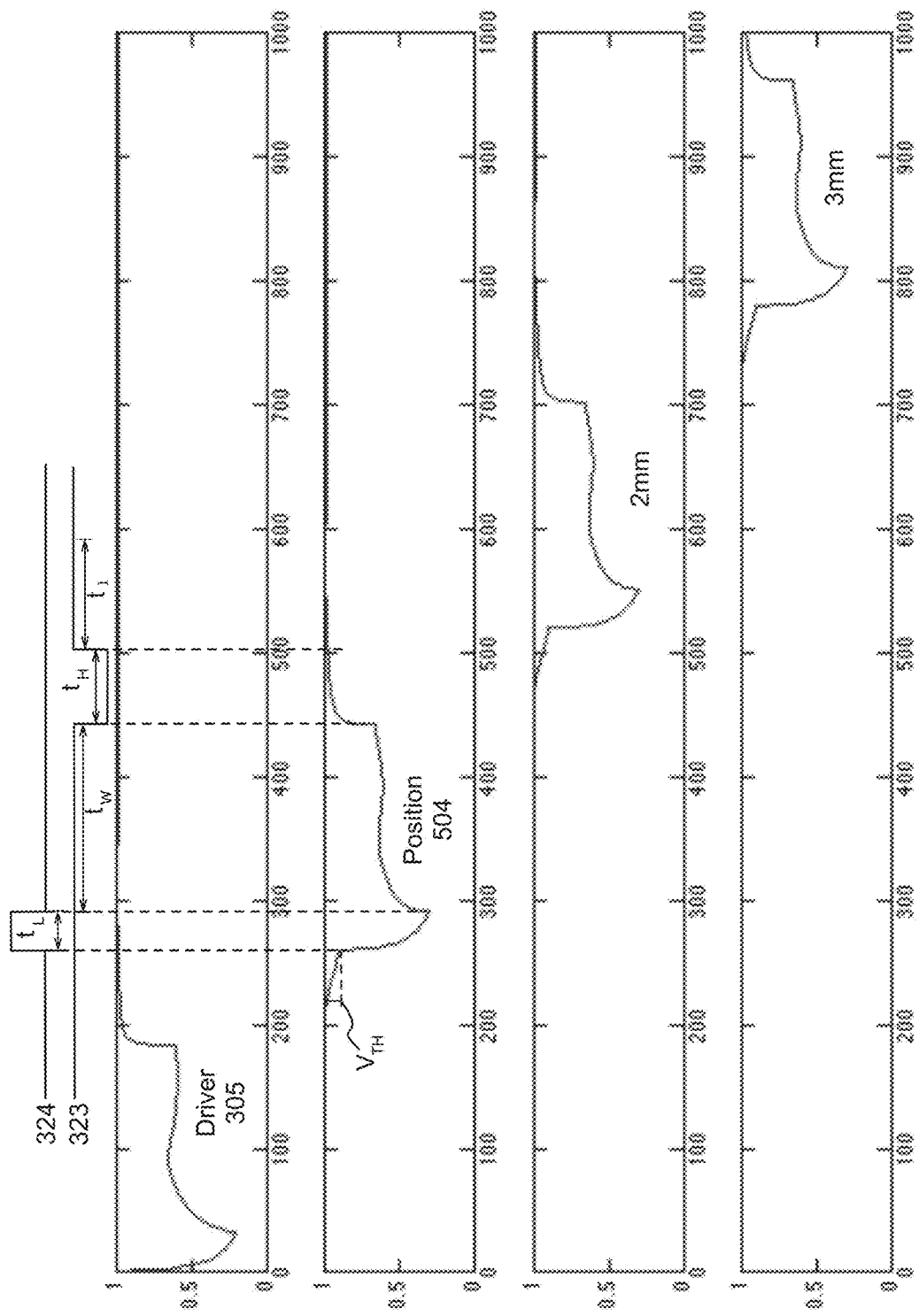
FIG. 5B illustrates a simulation of voltages that encode a signal across the repeater transmission line of FIG. 5A at different positions along the repeater transmission line, in accordance with one embodiment.

FIG. 5B illustrates a simulation of voltages that encode a signal over time at different positions along the repeater transmission line 500 of FIG. 5A, in accordance with one embodiment. The waveforms shown in FIG. 5 were produced using a Matlab® simulation setting a resistance of the transmission line to 20 kΩ/mm and a capacitance of 200 fFarad/mm. The top waveform corresponds to the voltage on the repeater transmission line 500 where the driver 305 is positioned (i.e., at 0 mm). The second waveform corresponds to the voltage at the position 504 on the repeater transmission line 500 and is located 1 mm from the driver 305. The third waveform corresponds to the voltage at a position on the repeater transmission line 500 that is located 2 mm from the driver 305. The bottom waveform corresponds to the voltage at a position on the repeater transmission line 500 that is located 3 mm from the driver 305.

The control signals 323 and 324 are illustrated for the fourth repeater 320 at the position 504 along the repeater transmission line 500. Similar control signals are generated by the second repeater 320. The y-axis is the voltage of the signal being transmitted and the x-axis is time in picoseconds. In one embodiment, as shown in FIG. 5B, the signal propagates at 4 mm/ns. Faster propagation can be realized with closer repeater spacing or a threshold voltage $V_{TH}$ that is closer to the first voltage level (i.e., higher when the first voltage level is the high supply voltage and lower when the first voltage level is the low supply voltage)

At zero picoseconds (ps), the repeater transmission line 500 is initially at a first voltage level (e.g., the positive supply voltage $V_{DD}$). In succession, each of the repeaters 320 senses the signal by detecting the transmission line falling to a detection threshold $V_{TH}$ at a position along the transmission line. The signal is sent further down the repeater transmission line 500 by each repeater 320 pulling the repeater transmission line 500 low for a fixed time interval $t_L$ in succession, to reinforce the signal transition from a second voltage level to a third voltage level. In one embodiment, the second voltage level equals the detection threshold $V_{TH}$. After a delay of $t_W$, each repeater 320 restores the repeater transmission line 500 to the first voltage level (by pulling the transmission line high for a time interval $t_H$. In one embodiment, the delay $t_W$ is zero. The delay $t_W$ is intended to give a subsequent repeater 320 that is further from the driver 305 on the repeater transmission line 500 some time to start reinforcing the signal transition on the repeater transmission line 500 before the repeater 320 starts restoring the transmission line 300 to the first voltage level. The delay $t_I$ is intended to give the same repeater 320 some time before becoming sensitive to detect a subsequent signal transition on the repeater transmission line 500 to avoid double triggering on the same pulse. The parameters $t_L$, $d_R$, $t_I$, and $V_{TH}$ may be chosen so that there is adequate margin against noise when a signal is transmitted in either direction along the repeater transmission line 500.

In one embodiment, after the time interval $t_H$ is complete, the repeater 320 remains insensitive to the voltage on the transmission line for an additional interval $t_I$. The interval $t_I$, which may be zero, is chosen to prevent a repeater 320 from mistakenly identifying an echo of the repeater's own signal transition, where the echo is generated by a downstream repeater 320. In one embodiment, $t_L$=30 ps, $t_W$=150 ps, $t_h$=150 ps and $t_I$=0 ps and signals may be driven at up to 3 Gb/second on the repeater transmission line 500. Faster signaling rates may be possible using a smaller $d_R$ or shorter time intervals for one or more of $t_L$, $t_W$, and $t_H$. Additionally, a tradeoff may be made between power and speed by varying one or more of $d_R$, $t_L$, $t_W$, and $t_H$.

Figure 6:
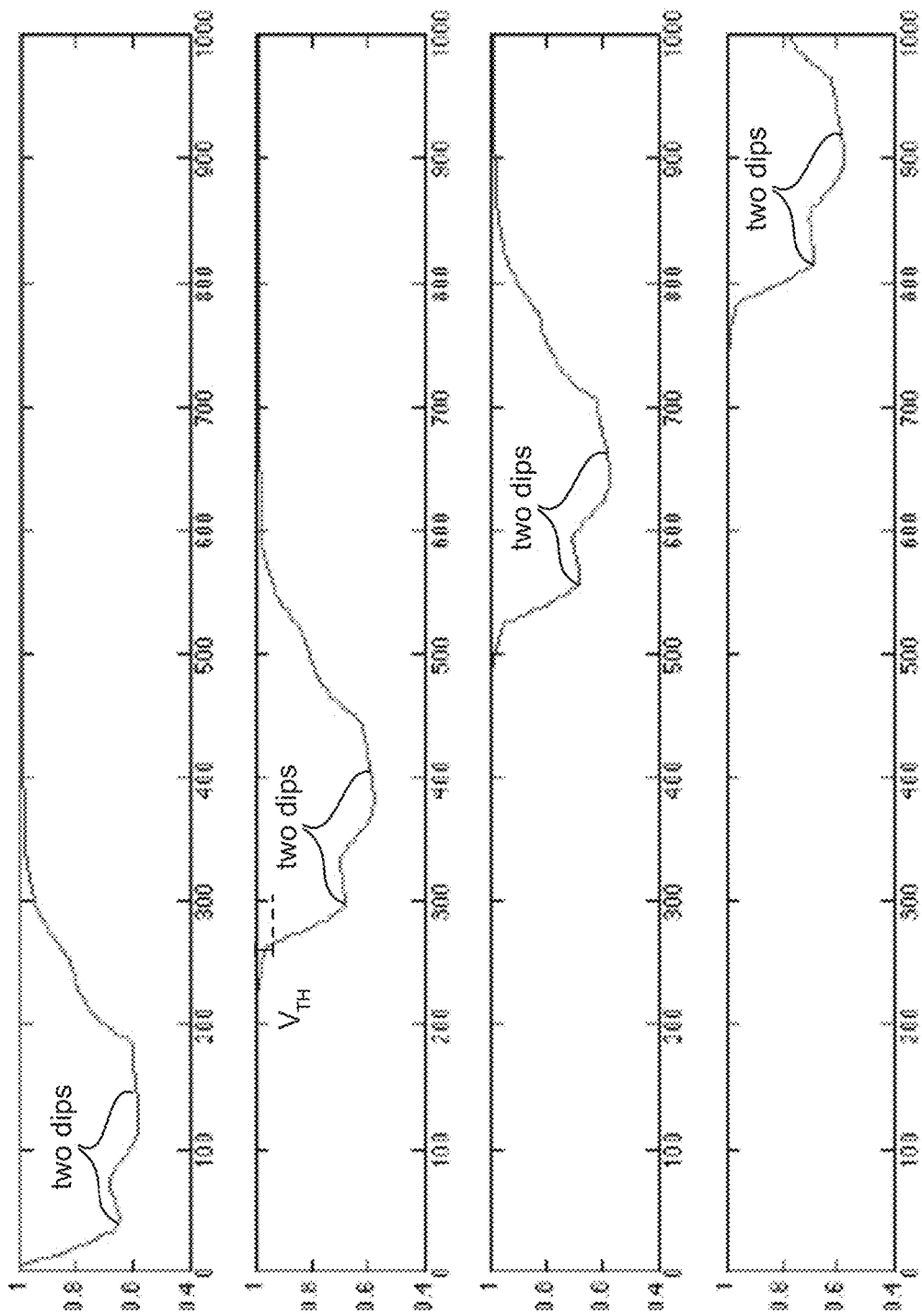
FIG. 6 illustrates a simulation of voltages that encode a signal across the repeater transmission line of FIG. 5A at different positions between repeaters along the repeater transmission line, in accordance with one embodiment.

FIG. 6 illustrates a simulation of voltages that encode a signal over time at different positions between repeaters 320 along the repeater transmission line 500 of FIG. 5A, in accordance with one embodiment. The waveforms shown in FIG. 6 were produced using a Matlab® simulation setting a resistance of the transmission line to 20 kΩ/mm and a capacitance of 200 fFarad/mm. The top waveform corresponds to the voltage on the repeater transmission line 500 halfway between the driver 305 and the position 501. The second waveform corresponds to the voltage 1 mm further down the repeater transmission line 500 between the position 504 and the next repeater 320 (not shown in FIG. 5A). The third waveform corresponds to the voltage 2 mm further down the repeater transmission line 500 between two other repeaters 320. The bottom waveform corresponds to the voltage at a position on the repeater transmission line 500 that is 3 mm further down the repeater transmission line 500. The y-axis is the voltage of the signal being transmitted and the x-axis is time in picoseconds.

In contrast with FIG. 5B that shows the voltage waveforms at repeaters 320, the waveforms in FIG. 6 show the voltage waveforms between the repeaters 320. While a repeater 320 pulls the repeater transmission line 500 down to about 0.3V locally, midway between adjacent repeaters 320 the repeater transmission line 500 only drops to about 0.6V. The two dips in each waveform correspond to a repeater 320 to the left of a position on the repeater transmission line 500 and a repeater 320 to the right of the position reinforcing the signal transition.

Figure 7:
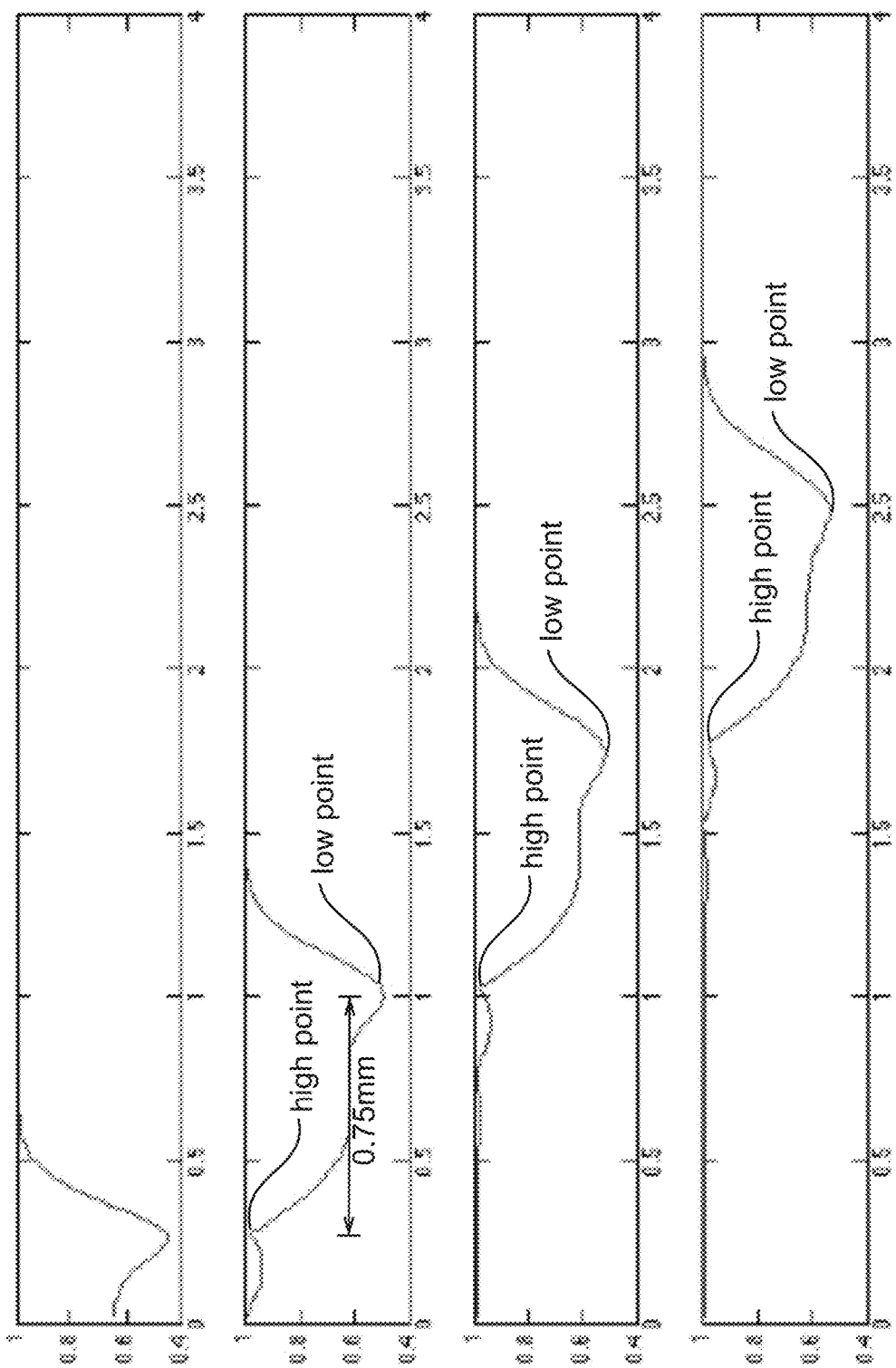
FIG. 7 illustrates a simulation of voltages that encode a signal across the repeater transmission line of FIG. 5A at different times, in accordance with one embodiment.

FIG. 7 illustrates a simulation of voltages that encode a signal across the repeater transmission line 500 of FIG. 5A at different times, in accordance with one embodiment. The waveforms shown in FIG. 7 were produced using a Matlab® simulation setting a resistance of the transmission line to 20 kΩ/mm and a capacitance of 200 fFarad/mm. The top waveform corresponds to the voltage on the repeater transmission line 500 at 100 ps after a signal transition is generated by the driver 305. The second waveform corresponds to the voltage on the repeater transmission line 500 at 300 ps after the signal transition was generated by the driver 305. As shown by the second waveform, the signal has propagated further down the repeater transmission line 500. The third waveform corresponds to the voltage on the repeater transmission line 500 at 500 ps after the signal transition was generated by the driver 305. The bottom waveform corresponds to the voltage on the repeater transmission line 500 at 700 ps after the signal transition was generated by the driver 305. The y-axis is the voltage of the signal being transmitted and the x-axis is the distance in μm along the repeater transmission line 500 measured from the driver 305.

For each of the second, third, and bottom waveforms, a high point corresponds to a repeater 320 restoring the repeater transmission line 500 to the first voltage level and 0.75 mm later a low point corresponding to a subsequent repeater 320 reinforcing the signal transition.

The configuration of the repeaters 320 allows signals to propagate down an RC transmission line (e.g., the repeater transmission line 500) very quickly and allows spacing of the repeaters 320 to be considerably larger than with conventional repeaters. As soon as a signal is detected by a repeater 320, the repeater 320 drives the signal with full strength. In contrast with a prior art repeater, such as the inverter 120, there is no need to wait for the signal to reach an inverter threshold. For example, a difference between the first and second voltages may equal 100 mV when a typical inverter threshold voltage is 500 mV. Also, each repeater 320 starts with a repeater transmission line that is already driven—by the previous repeater 320. In contrast, a prior art repeater, such as the inverter 120 starts with a transmission line that is at either the positive or negative supply voltage and generates a new current to pull the transmission line to either the negative or positive supply voltage, respectively.

The unit interval that determines the signal rate of this signaling system is $t_L+t_W+t_H+t_I$ which can be made very short allowing high-bandwidth signaling over lossy RC transmission lines when the repeaters 320 are coupled to the transmission lines. The delay from one repeater 320 reinforcing a signal transition to an adjacent repeater 320 reinforcing the signal transition is $$t_r = Krcl^2,$$

where r and c are the resistance and capacitance per mm, l is the distance between repeaters 320, and K is a constant that depends on the threshold voltage $V_{TH}$. (K~2.5 ln($V_{DD}/V_{TH}$)). In the examples shown in FIGS. 5B, 6, and 7 rc=4 ns/mm and K=0.25. The delay per mm is then $$t_{mm} = Krcl$$

Based on the equations for $t_r$ and $t_{mm}$, the propagation velocity is directly proportional to the distance between adjacent repeaters 320. With repeater spacing $d_R$ of 0.25 mm, the delay $t_{mm}$ is 250 ps/mm. If the repeater spacing $d_R$ is halved, the signal velocity doubles—to 125 ps/mm. When repeater spacing $d_R$ is halved, the timing intervals $t_L$, $t_W$, and $t_H$ should also be halved.

In one embodiment, $t_L$=30 ps, $t_W$=100 ps, and $t_H$=100 ps, and the signaling rate may be as high as 4 Gb/s. Halving the repeater spacing $d_R$ may then enable a signaling rate as high as 8 Gb/s.

Figure 8:
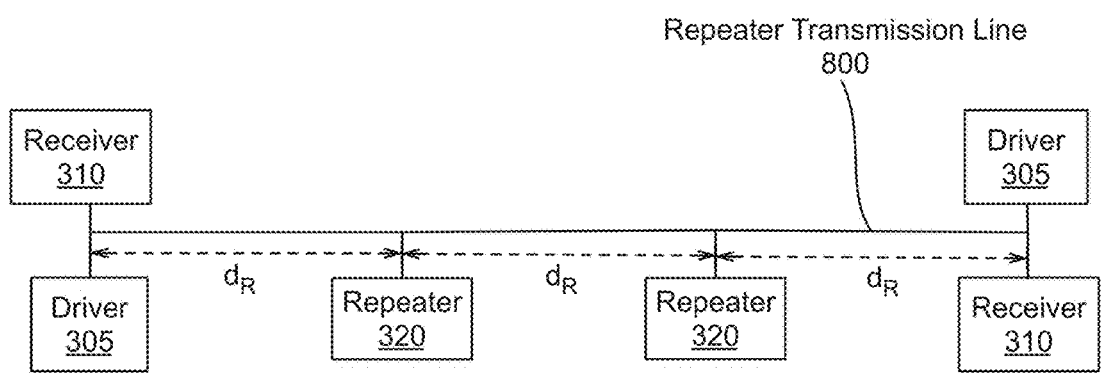
FIG. 8 illustrates a repeater transmission line, in accordance with another embodiment.

FIG. 8 illustrates a repeater transmission line 800, in accordance with another embodiment. Repeaters 320 are located at intervals $d_R$ along the repeater transmission line 300. Each repeater 320 is directly coupled to the repeater transmission line 800, but does not interrupt the current flow through the repeater transmission line 800. Each repeater 320 assists a signal that is transmitted from one of the two drivers 305 (i.e., transmitter circuit) to one of the receivers 310 (e.g., receiver circuit) rather than replacing the signal. The repeater transmission line 800 is coupled between the a first receiver 310 and driver 305 pair and a second receiver 310 and driver 305 pair to implement a bi-directional link enabling either driver 305 to transmit signals to the receiver 310 that is coupled to the opposing end of the repeater transmission line 800, respectively.

The repeater transmission line has been in the context of a single-ended signaling system. While a small $V_{TH}$ may be chosen to give low power dissipation and high propagation velocity, a small amount of noise coupled onto the repeater transmission line can cause a false detection of a signal transition when a small $V_{TH}$ is used. One approach to mitigating noise is to distribute the $V_{TH}$ in a manner that renders most noise sources common mode. For example, by distributing one "dummy" signal line that never switches and having $V_{TH}$ be a fixed voltage below the dummy signal line. Any noise that couples into both a normal signal line and the "dummy" signal line will be cancelled.

Alternatively, a differential technique may be used to mitigate noise sensitivity. Two repeater transmission lines (i.e., complementary transmission lines) may be used for each signal, a transmission line for SIGN, and a complement transmission line for SIGP. A FALSE value is encoded by transitioning SIGN from the first voltage level to the second voltage level and a TRUE value is encoded by transitioning SIGP from the first voltage level to the second voltage level. The differential technique also cancels common-mode noise, but at the expense of halving signaling density.

Figure 9:
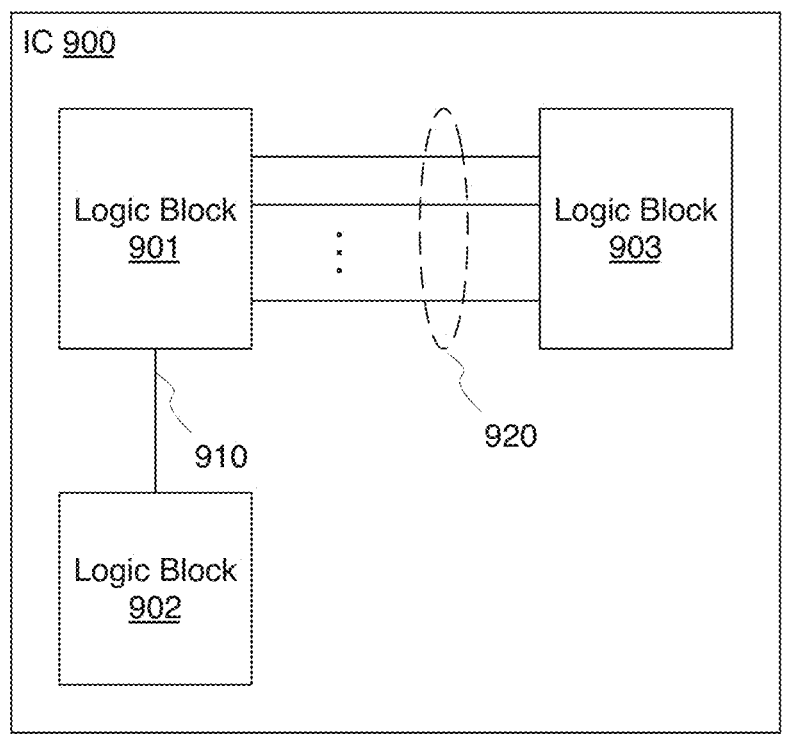
FIG. 9 illustrates an integrated circuit that includes a plurality of repeater transmission lines, in accordance with one embodiment.

FIG. 9 illustrates an integrated circuit 900 that includes repeater transmission lines 920, in accordance with one embodiment. The integrated circuit 900 may be formed in a silicon substrate and include logic such as CMOS logic. The integrated circuit 900 may be a central processing unit (CPU), a graphics processing unit (GPU), a vector processing unit (VPU), an application specific integrated circuit (ASIC), or the like. The IC 900 may include a plurality of logic blocks (e.g., 901, 902, 903, etc.). The logic blocks may comprise an arithmetic logic unit (ALU) or a scheduling unit, for example, of the IC 900. Data may be transmitted between the logic blocks via interconnects routed on the IC 900.

As shown in FIG. 9, a signal may be transmitted from logic block 901 to logic block 902 via a repeater transmission line 910 or a pair of repeater transmission lines 910 (when a differential technique is used). The repeater transmission line 910 may be implemented as any of repeater transmission lines 300, 500, or 800.

As also shown in FIG. 9, a plurality of signals may be transmitted from logic block 901 to logic block 903 via a plurality of repeater transmission lines 920. In other words, multiple repeater transmission lines 300, 500, or 800 may be implemented in parallel in order to transmit any number of signals from one logic block to another.

Figure 10:
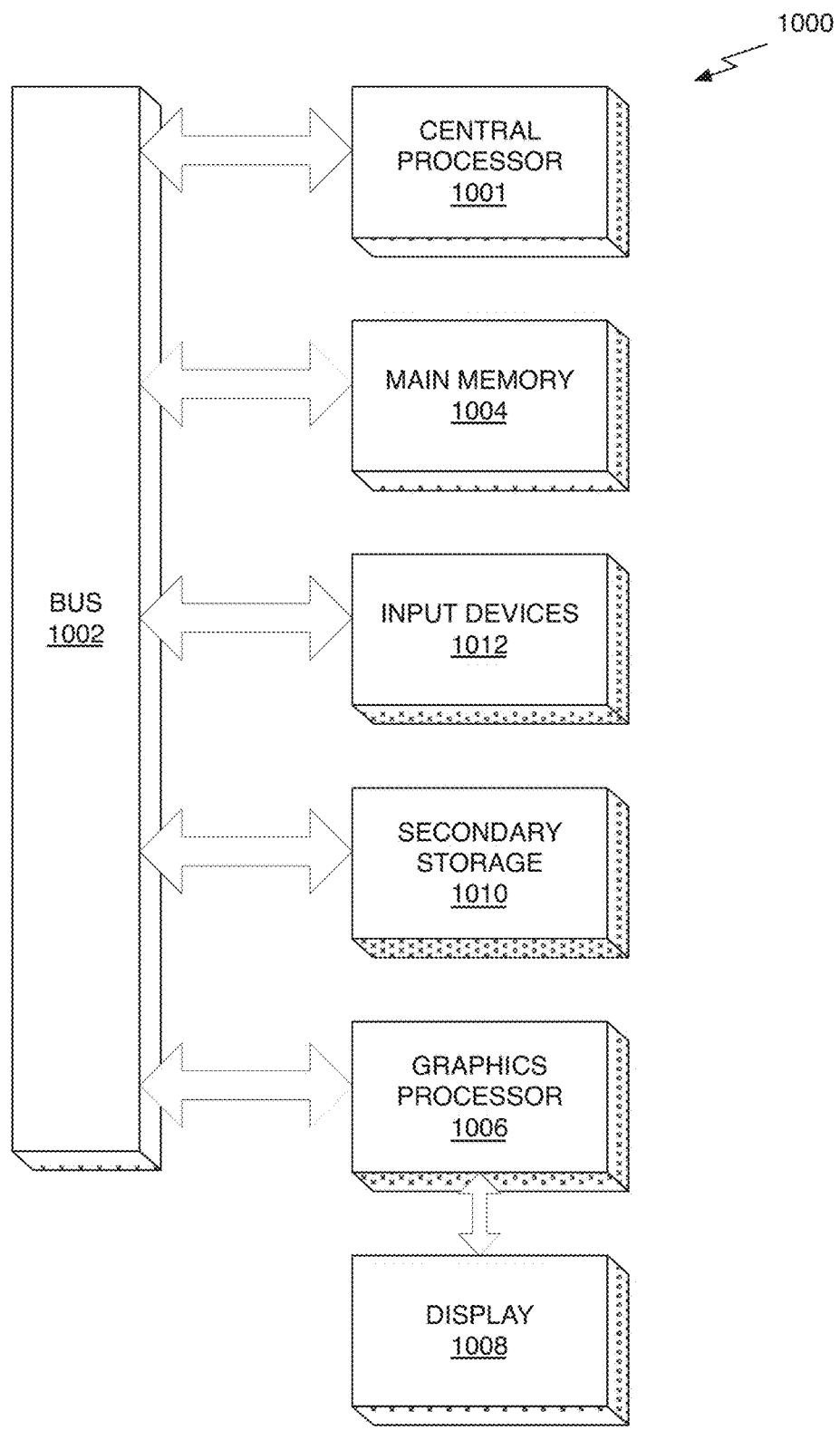
FIG. 10 illustrates an exemplary system in which the various architecture and/or functionality of the various previous embodiments may be implemented.

FIG. 10 illustrates an exemplary system 1000 in which the various architecture and/or functionality of the various previous embodiments may be implemented. As shown, a system 1000 is provided including at least one central processor 1001 that is connected to a communication bus 1002. The communication bus 1002 may be implemented using any suitable protocol, such as PCI (Peripheral Component Interconnect), PCI-Express, AGP (Accelerated Graphics Port), HyperTransport, or any other bus or point-to-point communication protocol(s). The system 1000 also includes a main memory 1004. Control logic (software) and data are stored in the main memory 1004 which may take the form of random access memory (RAM).

The system 1000 also includes input devices 1012, a graphics processor 1006, and a display 1008, i.e. a conventional CRT (cathode ray tube), LCD (liquid crystal display), LED (light emitting diode), plasma display or the like. User input may be received from the input devices 1012, e.g., keyboard, mouse, touchpad, microphone, and the like. In one embodiment, the graphics processor 1006 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1000 may also include a secondary storage 1010. The secondary storage 1010 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1004 and/or the secondary storage 1010. Such computer programs, when executed, enable the system 1000 to perform various functions. The memory 1004, the storage 1010, and/or any other storage are possible examples of computer-readable media.

In one embodiment, the architecture and/or functionality of the various previous figures may be implemented in the context of the central processor 1001, the graphics processor 1006, an integrated circuit (not shown) that is capable of at least a portion of the capabilities of both the central processor 1001 and the graphics processor 1006, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1000 may take the form of a desktop computer, laptop computer, server, workstation, game consoles, embedded system, and/or any other type of logic. Still yet, the system 1000 may take the form of various other devices including, but not limited to a personal digital assistant (PDA) device, a mobile phone device, a television, etc.

Further, while not shown, the system 1000 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   detecting, by a first repeater circuit that is coupled to a transmission line at a first position, a transition of a signal driven by a first transmitter circuit on the transmission line from a first voltage level to a second voltage level;
   reinforcing, by the first repeater circuit, the transition of the signal on the transmission line at the first position from the second voltage level to a third voltage level without interrupting a current through the transmission line,
   wherein no additional transition of the signal occurs at the first position during the reinforcing; and
   restoring, by activating either a pull-up switching mechanism or a pull-down switching mechanism that is coupled to the transmission line at the first position in the first repeater circuit, the transmission line at the first position to the first voltage level prior to the detecting of a next transition of the signal driven by the first transmitter circuit, wherein the first repeater circuit is insensitive to other signal transitions on the transmission line at the first position for a first time interval set within a repeater control circuit, the first time interval starting when the restoring ends.

2. The method of claim 1, wherein the second voltage level is a predetermined threshold voltage level that is lower than the first voltage level and higher than the third voltage level.

3. The method of claim 1, further comprising, between the reinforcing and the restoring, releasing the transmission line by disabling the reinforcing of the transition of the signal on the transmission line at the first position by the first repeater circuit.

4. The method of claim 1, wherein the reinforcing is performed for a second time interval and the restoring is performed for a third time interval.

5. The method of claim 4, wherein the second time interval ends before the third time interval starts.

6. The method of claim 1, wherein the first repeater circuit is sensitive to detect the next transition of the signal after the first time interval.

7. The method of claim 3, further comprising:
   detecting, by a second repeater circuit that is coupled to the transmission line at a second position on the transmission line that is further from the first transmitter circuit relative to the first position on the transmission line, the transition of the signal from the first voltage level to the second voltage level on the transmission line at the second position; and
   reinforcing, by the second repeater circuit, the transition of the signal on the transmission line at the second position to the third voltage level without interrupting the current through the transmission line.

8. The method of claim 1, further comprising detecting, by a second repeater circuit that is coupled to a second transmission line at a second position, a complement transition of a second signal driven by a second transmitter circuit on the second transmission line from the first voltage level to the second voltage level, wherein the transition encodes a true value of the signal and the complement transition encodes a false value of the signal.

9. A repeater circuit, the repeater circuit comprising:
   a first switching mechanism coupled between a first power supply voltage and a first position on a transmission line; and
   a repeater control circuit that is configured to:
      detect a transition of a signal driven by a first transmitter on the transmission line from a first voltage level to a second voltage level on the transmission line at the first position;
      control the first switching mechanism to reinforce the transition of the signal on the transmission line at the first position from the second voltage level to a third voltage level without interrupting a current through the transmission line, wherein no additional transition of the signal occurs at the first position during the reinforcing; and
      activate a second switching mechanism that is either a pull-up switching mechanism or a pull-down switching mechanism to restore the transmission line at the first position to the first voltage level prior to the detecting of a next transition of the signal driven by the first transmitter circuit, wherein the first repeater circuit is insensitive to other signal transitions on the transmission line at the first position for a first time interval set within the repeater control circuit, the first time interval starting when the restoring ends.

10. The repeater circuit of claim 9, wherein the second switching mechanism is coupled between a second power supply voltage and the first position on the transmission line.

11. The repeater circuit of claim 10, wherein the first power supply voltage is a low supply voltage and the second power supply voltage is a high supply voltage.

12. The repeater circuit of claim 9, wherein the second voltage level is a predetermined threshold voltage level that is lower than the first voltage level and higher than the third voltage level.

13. The repeater circuit of claim 9, wherein the repeater control circuit controls the first switching mechanism to reinforce the transition of the signal by activating a pull-down switch mechanism for a second time interval.

14. The repeater circuit of claim 10, wherein the repeater control circuit is further configured to, between controlling the first switching mechanism to reinforce the transition of the signal and controlling the second switching mechanism to restore the transmission line at the first position, control the first switching mechanism to release the transmission line at the first position by disabling the reinforcing of the transition of the signal.

15. The repeater circuit of claim 9, wherein the first repeater circuit is sensitive to detect the next transition of the signal after the first time interval.

16. The repeater circuit of claim 14, wherein the transition of the signal on the transmission line at the first position is reinforced for a second time interval, the transmission line is released at the first position for a third time interval, and the transmission line is restored at the first position for a fourth time interval.

17. The repeater circuit of claim 16, wherein the second time interval ends before the third time interval starts.

18. An integrated circuit, the integrated circuit comprising:
   a transmission line that is directly coupled to a first transmitter circuit; and
   a first repeater circuit that is coupled to the transmission line at a first position and configured to:
   detect a transition of a signal driven by the first transmitter circuit on the transmission line from a first voltage level to a second voltage level on the transmission line at the first position;
   reinforce the transition of the signal on the transmission line at the first position from the second voltage level to a third voltage level without interrupting a current through the transmission line, wherein no additional transition of the signal occurs at the first position during the reinforcing; and
   restore, by activating either a pull-up switching mechanism or a pull-down switching mechanism that is coupled to the transmission line at the first position, the transmission line at the first position to the first voltage level prior to the detecting of a next transition of the signal driven by the first transmitter circuit, wherein the first repeater circuit is insensitive to other signal transitions on the transmission line at the first position for a first time interval set within a control circuit, the first time interval starting when the restoring ends.

19. The integrated circuit of claim 18, further comprising a second repeater circuit that is coupled to the transmission line at a second position that is further from the first transmitter circuit relative to the first position and configured to:
   detect the transition of the signal from the first voltage level to the second voltage level on the transmission line at the second position; and
   reinforce the transition of the signal on the transmission line at the second position to the third voltage level without interrupting the current through the transmission line.

20. The method of claim 1, further comprising, after the restoring and prior to detecting the next transition of the signal driven by the first transmitter circuit, releasing the transmission line by disabling the restoring of the transition of the signal on the transmission line at the first position.

* * * * *